United States Patent
Hirschauer et al.

(10) Patent No.: US 6,392,614 B1
(45) Date of Patent: May 21, 2002

(54) CONTRAST ENHANCEMENT DEVICE FOR LED ARRAYS

(75) Inventors: Karl Hirschauer, Tallman, NY (US); Fred Duray, Easton; Joseph M. Doering, New Haven, both of CT (US)

(73) Assignee: Trans-Lux Corporation, Norwalk, CT (US)

( * ) Notice: Subject to any disclaimer, the term of this patent is extended or adjusted under 35 U.S.C. 154(b) by 866 days.

(21) Appl. No.: 08/618,120

(22) Filed: Mar. 19, 1996

(51) Int. Cl.[7] ................................................ G09G 3/06
(52) U.S. Cl. ............................ 345/44; 345/82; 348/818; 348/824
(58) Field of Search ........................... 345/33, 44, 46, 345/82; 348/819, 820, 821, 824, 818

(56) References Cited

U.S. PATENT DOCUMENTS

| | | | |
|---|---|---|---|
| 4,701,801 A | * 10/1987 | Hobbins et al. | ............ 348/819 |
| 5,139,850 A | * 8/1992 | Clarke et al. | ................ 348/820 |
| 5,443,510 A | * 8/1995 | Shetty et al. | .................. 419/2 |

\* cited by examiner

Primary Examiner—Kent Chang
(74) Attorney, Agent, or Firm—Pitney, Hardin, Kipp & Szuch LLP

(57) ABSTRACT

A contrast enhancement device for an LED display is achieved by providing rectangular wire screen of substantially the dimensions of the LED-bearing face of a module block LED array. The edges of the rectangular wire screen are ultrasonically welded to the edges of the LED-bearing face of the module block LED array.

8 Claims, 1 Drawing Sheet

CONTRAST ENHANCEMENT DEVICE FOR LED ARRAYS

BACKGROUND OF THE INVENTION

1. Field of the Invention

This invention pertains to the use of wire screens ultrasonically welded or otherwise attached to individual module block LED arrays for the purpose of contrast enhancement.

2. Description of the Prior Art

In the prior art, it is known to use a wire screen placed directly in front of an LED display in order to enhance the contrast of the displayed image and to reduce glare. The wire screen achieves these advantages by absorbing a large portion of the ambient light without changing the color of the emitted light. Similarly, the screen filters out off-peak frequencies so that the color of the emitted light is purer than otherwise. Additionally, the wire screen can act as a radiator to reduce the temperature of the operating LED and therefore increase the life of the LED. The wire screen can also reduce EMI if an electrical path to ground is provided.

In the prior art, the installation of the screen is done after the plurality of module block LED arrays have been arranged into a large display and a single large piece of wire screen is fastened to the entire display. However, this can be deficient in larger displays due to the size of the wire screen involved. The large pieces of wire screen can be difficult to obtain, to handle and to install. Moreover, holding the entire wire screen taut can be difficult in larger displays. Any sagging of the wire screen can lead to distortion in the image which makes the dots of module block LED arrays appear non-uniform.

The use of a single screen for a large display of module block LED arrays further increases the difficulty of maintenance of the display in that the screen must be removed to access the module block LED arrays.

Other attempts to enhance contrast have included the use of etched glass which is deficient in that the heat of the LEDs is not adequately dissipated. The use of dark or colored glass has the further disadvantage of changing the color purity of the emitted light.

Miniature louvers have also been used in the prior art but are expensive and difficult to use for large-scale displays.

OBJECTS AND SUMMARY OF THE INVENTION

It is therefore an object of this invention to provide a device for enhancing contrast in a display of module block LED arrays, without limitation on the size of the display.

It is therefore a further object of this invention to provide a device for reducing glare in a display of module block LED arrays.

It is therefore a further object of this invention to provide a contrast enhancement device for a display of module block LED arrays which does not impair the color purity of the emitted light.

It is therefore a further object of this invention to provide a contrast enhancement device for a display of module block LED arrays which is not prone to distorting the displayed image.

It is therefore a still further object of this invention to provide a device which reduces the operating temperature of a display of module block LED arrays.

It is therefore a still further object of this invention to provide a contrast enhancement device for a display of module block LED arrays which does not substantially increase the difficulty of maintenance of the display.

It is therefore a still further object of this invention to provide a device which has the potential for reducing EMI from a display of module block LED arrays.

It is therefore a final object of this invention to provide a contrast enhancement device for a display of module block LED arrays which is low in cost and simple to install.

These and other objects are attained by providing a piece of metallic wire screen which has been dye-cut to the size of the front face of a module block LED array and ultrasonically welded or otherwise attached to the front face of a module block LED array. This ultrasonic welding or other attachment is preferably done as part of the manufacturing process, or at least prior to the assembly of the display from the plurality of module block LED arrays. The attachment of the individual dye-cut pieces of screen to the individual module block LED arrays allows the resulting display to reach unlimited size without causing the disadvantages associated with using a single piece of screen for the entire display —unavailability of large screen sizes, difficulty in installing large screen sizes, difficulty in maintaining the tautness of the screen on the display, difficulty in servicing the display.

The individual dye-cut pieces of screen, however, achieve the advantages of contrast enhancement, glare reduction, color purity, lack of distortion in the display image, heat dissipation and the possibility of EMI reduction.

Moreover, the individual dye-cut pieces of screen are relatively simple to install and do not substantially increase the difficulty of maintenance of the resulting display.

These advantages are achieved at very low cost.

BRIEF DESCRIPTION OF THE DRAWING

Further objects and advantages of the invention will become apparent from the following description and claims, and from the accompanying drawing, wherein:

DETAILED DESCRIPTION OF THE PREFERRED EMBODIMENT

Figure 1:
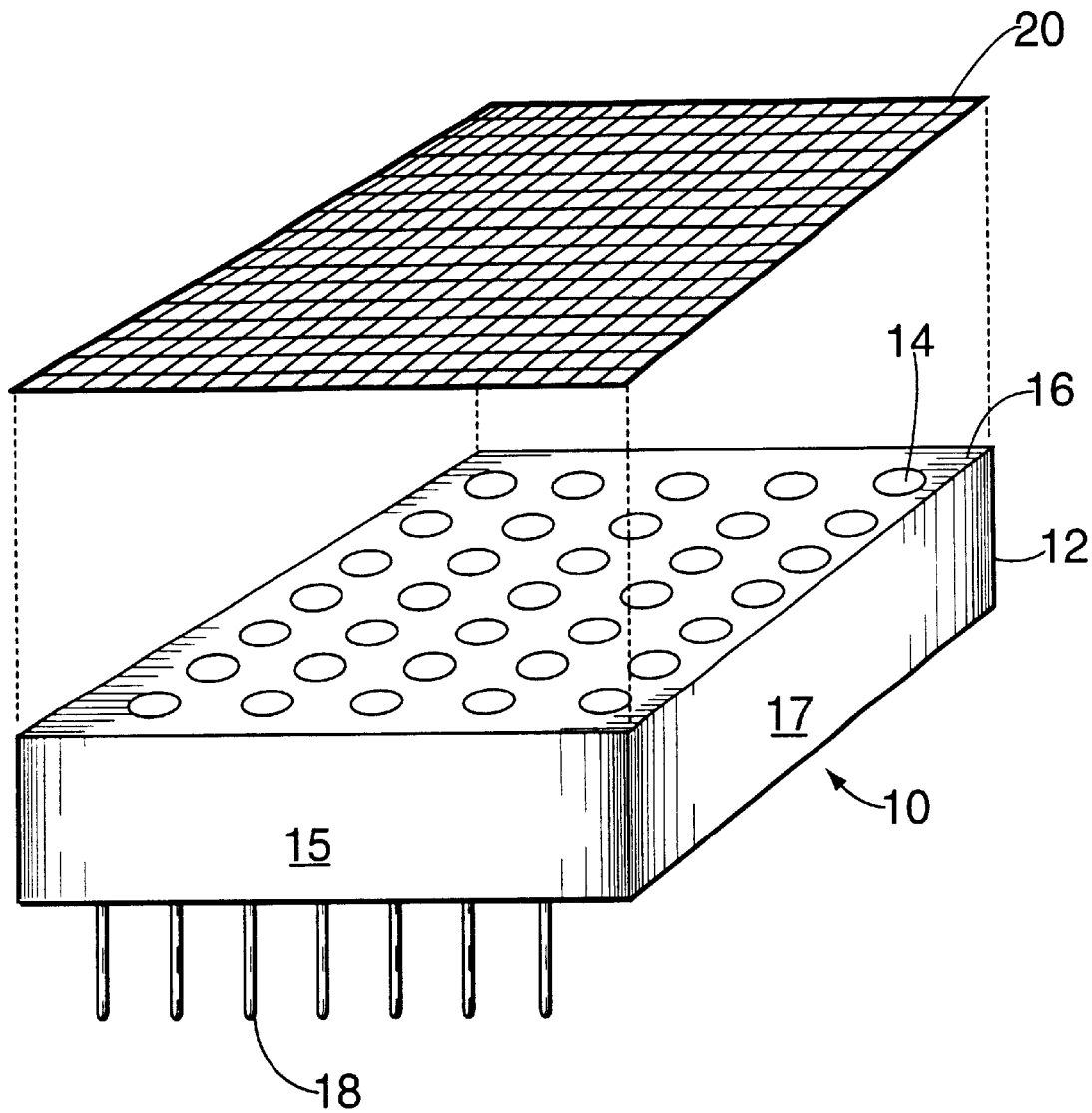
FIG. 1 is an exploded view in perspective of the contrast enhancement device of the present invention.

Referring now to FIG. 1, one sees an exploded view in perspective of the contrast enhancement device 10 of the present invention. The module block LED array 12 is a standard substantially rectangular parallelpiped configuration with an array of LEDs 14 on an upper rectangular face 16 thereof. The array of LEDs 14 is illustrated as a five by seven configuration, but other configurations, such as four by eight, are possible. The module block LED array 12 has downwardly extending rectangular sides 15, 17. Electrical contacts 18 extend downwardly from the lower face (not shown) connected immediately inwardly adjacent from face 15 and likewise from the lower face connected immediately inwardly adjacent from the face (not shown) directly opposite from face 15.

Element 20 is a rectangular wire screen of a length and width substantially equal to that of the upper rectangular face 16 of module block LED array 12. The wire of rectangular wire screen are typically spaced at one thirty-second of an inch intervals with the metallic wire itself being of a width of about one fourth or one fifth of the width of the interval. Variations in these proportions may be used depending upon the specific application.

The edges of rectangular wire screen 20 are ultrasonically welded to the edges of upper rectangular face 16 of module block LED array. The presence of the rectangular wire screen 20 immediately over the LEDs 14 blocks much of the incoming ambient light and filters the off-peak frequencies thereby enhancing the color purity of the light output. The presence of the rectangular wire screen 20 further enhances the contrast of the light output from device 10 and reduces the glare therefrom. Moreover, the rectangular wire screen 20 serves as a radiator which cools the LEDs 14 and thereby prolongs the life of the LEDs 14. Additionally, the metallic character of the wires of rectangular wire screen 20 provides the opportunity for EMI reduction if an electrical path is provided to ground.

As rectangular wire screen 20 is supported by the individual module block LED array 12, a display of virtually unlimited size can be assembled from a plurality of module block LED arrays 12 without the added burdens, such as sagging of the screen and the resulting image distortion, of an ever larger screen covering the entire display. Similarly, each module block LED array 12 can be individually removed from the display for service without the need for removing a large screen.

Thus the several aforementioned objects and advantages are most effectively attained. Although a single preferred embodiment of the invention has been disclosed and described in detail herein, it should be understood that this invention is in no sense limited thereby and its scope is to be determined by that of the appended claims.

What is claimed is:

1. An LED display device comprising:
    a plurality of module block LED arrays, each of said module LED arrays including at least one LED on a selected face thereof, and
    substantially each of said module block LED arrays including a respective individual wire screen attached to said selected face immediately over said at least one LED whereby light emanating from said at least one LED passes through said wire screen.

2. The LED display device of claim 1 wherein said wire screen is of substantially a size and shape of said selected face.

3. The LED display device of claim 2 wherein said selected face and said wire screen are substantially rectangular.

4. The LED display device of claim 3 wherein said wire screen is comprised of metal.

5. The LED display device of claim 4 wherein edges of said wire screen are ultrasonically welded to edges of said selected face.

6. The LED display device of claim 1 wherein said wire screen enhances contrast and reduces glare of images formed by the LED display device.

7. The LED display device of claim 1 wherein said wire screen provides heat dissipation for the LED display device.

8. The LED display device of claim 1 wherein said respective individual wire screens allow large LED display devices to be formed without sagging of said respective individual wire screens.

* * * * *